(12) United States Patent
Sawada et al.

(10) Patent No.: US 8,785,880 B2
(45) Date of Patent: Jul. 22, 2014

(54) CHROMATIC ABERRATION CORRECTOR AND ELECTRON MICROSCOPE

(71) Applicant: JEOL Ltd., Tokyo (JP)

(72) Inventors: Hidetaka Sawada, Tokyo (JP); Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/102,838

(22) Filed: Dec. 11, 2013

(65) Prior Publication Data

US 2014/0158901 A1  Jun. 12, 2014

(30) Foreign Application Priority Data

Dec. 11, 2012 (JP) ................. 2012-270069

(51) Int. Cl.
*G21K 1/08* (2006.01)
*H01J 3/14* (2006.01)
*H01J 3/26* (2006.01)
*H01J 49/42* (2006.01)

(52) U.S. Cl.
USPC .............. 250/396 R; 250/396 ML; 250/306; 250/307; 250/310; 250/311

(58) Field of Classification Search
USPC ....... 250/396 R, 396 ML, 306, 307, 310, 311
See application file for complete search history.

(56) References Cited

U.S. PATENT DOCUMENTS 8,178,850 B2 * 5/2012 Sawada et al. ............ 250/396 R

FOREIGN PATENT DOCUMENTS

JP        2010114068 A     5/2010

* cited by examiner

*Primary Examiner* — Jack Berman
*Assistant Examiner* — Meenakshi Sahu
(74) *Attorney, Agent, or Firm* — The Webb Law Firm

(57) ABSTRACT

The chromatic aberration corrector (100) has a first multipole element (110) for producing a first electromagnetic field and a second multipole element (120) for producing a second electromagnetic field. The first multipole element (110) first, second, and third portions (110a, 110b, 110c) arranged along an optical axis (OA) having a thickness and producing a quadrupole field in which an electric quadrupole field and a magnetic quadrupole field are superimposed. In the first and third portions (110a, 110c), the electric quadrupole field is set stronger than the magnetic quadrupole field. In the second portion (110b), the magnetic quadrupole field is set stronger than the electric quadrupole field. The second portion (110b) produces a two-fold astigmatism component that is opposite in sign to two-fold astigmatism components produced by the first portion (110a) and third portion (110c).

8 Claims, 9 Drawing Sheets

FIG. 4
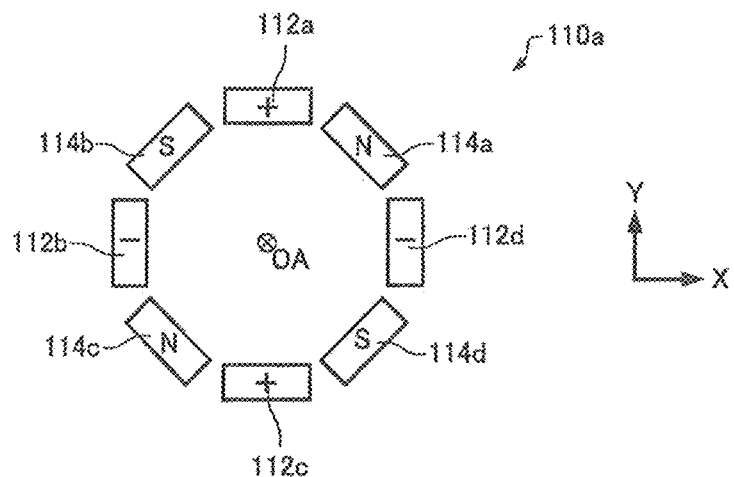
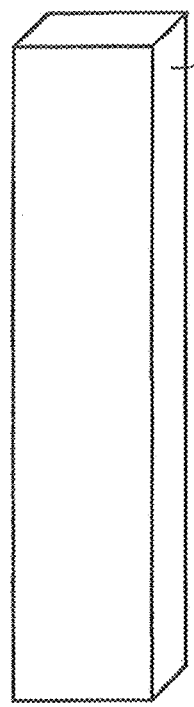
FIG. 5A
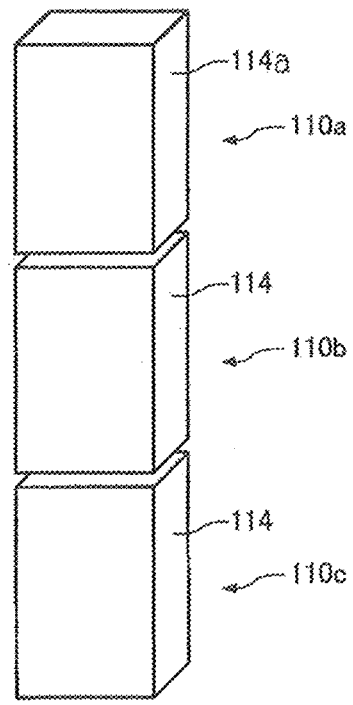
FIG. 5B

CHROMATIC ABERRATION CORRECTOR AND ELECTRON MICROSCOPE

BACKGROUND OF THE INVENTION

1. Field of the Invention

The present invention relates to a chromatic aberration corrector and electron microscope.

2. Description of Related Art

In an electron microscope such as a transmission electron microscope (TEM) or a scanning electron microscope (SEM), chromatic aberration is one factor deteriorating resolution. If chromatic aberration is corrected, resolution is improved.

For example, JP-A-2010-114068 discloses a chromatic aberration corrector for correcting chromatic aberration using two multipole elements each of which has a thickness along the optical axis of an electron beam and produces an electromagnetic field. In the chromatic aberration corrector of JP-A-2010-114068, negative chromatic aberration is generated to cancel out positive chromatic aberration in an objective lens. Thus, the chromatic aberration in the objective lens is corrected.

More specifically, the chromatic aberration corrector of JP-A-2010-114068 has a first multipole element having a first thickness along the optical axis of a charged particle beam and producing a first static electromagnetic field of two-fold symmetry, a second multipole element having a second thickness along the optical axis and producing a second static electromagnetic field of two-fold symmetry, and a transfer lens disposed between the first and second multipole elements. In the first and second static electromagnetic fields, two-fold magnetic astigmatisms of the charged particle beam cancel out each other under given conditions. In the first and second multipole elements, concave lens effects are produced by a combination of aberrations in quadrupole fields having thicknesses.

In the chromatic aberration corrector of JP-A-2010-114068, an electric field is employed in addition to a magnetic field in each multipole element. In such a multipole element, field charging and quite slight voltage instability, for example, are major causes leading to a deterioration of the ultimate resolution of the electron microscope. As the length (thickness) of a multipole element taken along the optical axis is increased, the electric field undergoes these noise components over a longer distance. This increases the amount of perturbations of the electron beam. Therefore, reducing the length of the multipole element leads to an improvement of the resolution. In order to improve the resolution by reducing the length of each multipole element, it is necessary to efficiently produce negative chromatic aberration.

SUMMARY OF THE INVENTION

One object associated with some aspects of the present invention is to provide a chromatic aberration corrector capable of correcting aberrations by efficiently producing negative chromatic aberrations.

(1) A chromatic aberration corrector associated with the present invention is for use with an electron microscope and includes a first multipole element for producing a first static electromagnetic field and a second multipole element for producing a second electromagnetic field. The first multipole element has a first portion, a second portion, and a third portion arranged along an optical axis. Each of the first, second, and third portions has a thickness in the direction of travel of an electron beam, and produces a quadrupole field in which an electric quadrupole field and a magnetic quadrupole field are superimposed. In the first portion, the electric quadrupole field is set stronger than the magnetic quadrupole field. In the second portion, the magnetic quadrupole field is set stronger than the electric quadrupole field. In the third portion, the electric quadrupole field is set stronger than the magnetic quadrupole field. The second portion produces a two-fold astigmatism component that is opposite in sign to two-fold astigmatism components produced by the first and third portions. The second electromagnetic field is angularly shifted by 90 degrees about the optical axis with respect to the first electromagnetic field.

In this chromatic aberration corrector, the orbit of the electron beam can be varied greatly by the three portions of the first multipole element and so chromatic aberration can be produced more efficiently, for example, than where there is only one stage of multipole element.

(2) In one feature of this chromatic aberration corrector, the electric quadrupole field component of the first electromagnetic field may be constant along the optical axis.

This chromatic aberration corrector is simple in structure and can produce electric quadrupole fields.

(3) In another feature of this chromatic aberration corrector, the first multipole element may have plural electrodes extending from the first portion to the third portion. The electrodes may produce uniform electric quadrupole fields in all of the first, second, and third portions.

This chromatic aberration corrector is simple in structure and can produce electric quadrupole fields.

(4) In a further feature of this chromatic aberration corrector, there may be further provided a transfer lens disposed between the first multipole element and the second multipole element.

(5) In an additional feature of this chromatic aberration corrector, there may be further provided: a third multipole element for superimposing an electric or magnetic field of four-fold symmetry on the first electromagnetic field; and a fourth multipole element for superimposing an electric or magnetic field of four-fold symmetry on the second electromagnetic field.

(6) In a still other feature of this chromatic aberration corrector, there may be further provided: a third multipole element for superimposing an electric or magnetic field of three-fold symmetry on the first electromagnetic field; and a fourth multipole element for superimposing an electric or magnetic field of three-fold symmetry on the second electromagnetic field.

(7) In a yet other feature of this chromatic aberration corrector, the first and third portions may have concave lens action. The second portion may have convex lens action.

(8) An electron microscope associated with the present invention includes a chromatic aberration corrector associated with the present invention.

Since this electron microscope includes a chromatic aberration corrector associated with the present invention, the first multipole element can have a reduced length or thickness. Hence, the resolution can be improved.

BRIEF DESCRIPTION OF THE DRAWINGS

FIG. 4 is a schematic plan view of the first portion of the first multipole element of the chromatic aberration corrector shown in FIG. 2.

FIG. 5A is a schematic perspective view of electrodes of the first multipole element of the chromatic aberration corrector shown in FIG. 2.

FIG. 5B is a schematic perspective view of magnetic poles of the first multipole element of the chromatic aberration corrector shown in FIG. 2.

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. First Embodiment 1.1. Configuration of Chromatic Aberration Corrector

First, the configuration of a chromatic aberration corrector associated with a first embodiment of the present invention is described with reference to some drawings. This corrector is for use with an electron microscope that irradiates a subject to be observed with an electron beam and produces a magnified image of the subject. Examples of electron microscope include a transmission electron microscope (TEM), a scanning transmission electron microscope (STEM), and a scanning electron microscope (SEM).

Figure 1:
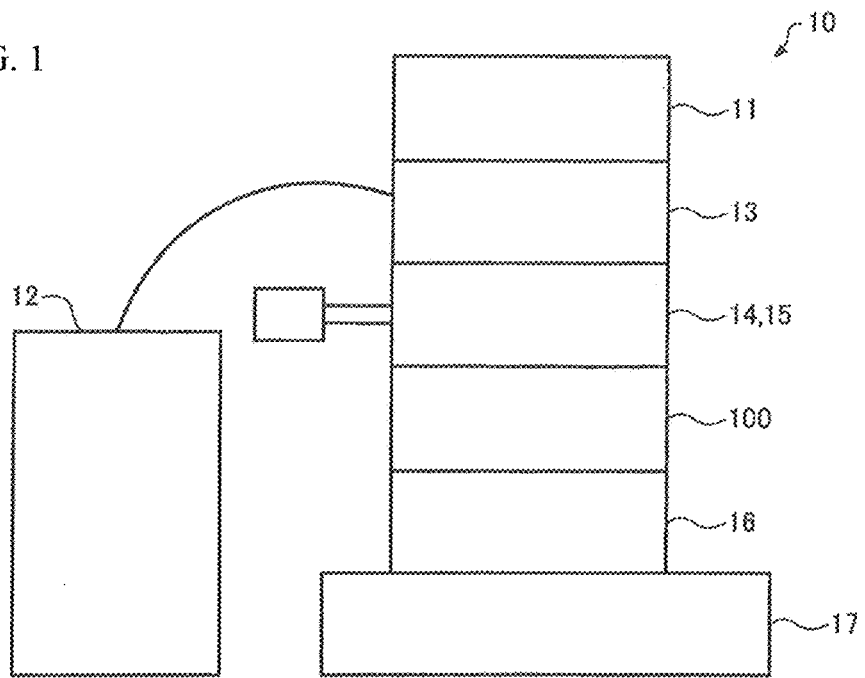
FIG. 1 is a block diagram of an electron microscope equipped with a chromatic aberration corrector associated with a first embodiment of the present invention.

FIG. 1 shows the configuration of an electron microscope 10 equipped with a chromatic aberration corrector 100 associated with the first embodiment. A case in which the chromatic aberration corrector 100 is equipped in a transmission electron microscope is described. That is, the chromatic aberration corrector 100 is adapted for use with a transmission electron microscope.

The electron microscope 10 is configured including an electron gun 11, a high-voltage control portion 12, condenser lenses 13, an objective lens 14, a specimen stage 15, the chromatic aberration corrector 100, an intermediate projector lens 16, and an observation chamber 17. In the electron microscope 10, the chromatic aberration corrector 100 is used in the imaging system.

The electron gun 11 has a high-voltage power supply under control of the high-voltage control portion 12 and produces an electron beam.

The condenser lenses 13 focus the electron beam produced by the electron gun 11. The focused beam reaches the objective lens 14 and specimen stage 15. The condenser lenses 13 constitute an illumination system for irradiating a specimen on the specimen stage 15 with the electron beam.

The objective lens 14 is a first stage of lens for focusing the electron beam transmitted through the specimen. The specimen stage 15 holds the specimen thereon. The electron beam transmitted through the specimen enters the chromatic aberration corrector 100. Objective minilenses 141 and 142 (FIG. 2) may be disposed between the objective lens 14 and the chromatic aberration corrector 100.

The chromatic aberration corrector 100 corrects chromatic aberration in the objective lens 14. Details of the corrector 100 are described later. The electron beam whose chromatic aberration has been corrected by the chromatic aberration corrector 100 reaches the intermediate projector lens 16.

The intermediate projector lens 16 cooperates with the objective lens 14 to constitute an imaging system (imaging lens system) for focusing the electron beam transmitted through the specimen. The intermediate projector lens 16 focuses the beam onto a camera (not shown) within the observation chamber 17.

Since the electron microscope 10 contains the chromatic aberration corrector 100, chromatic aberration in the imaging system (i.e., the objective lens 14) can be corrected. Accordingly, the electron microscope 10 can have high resolution.

Figure 2:
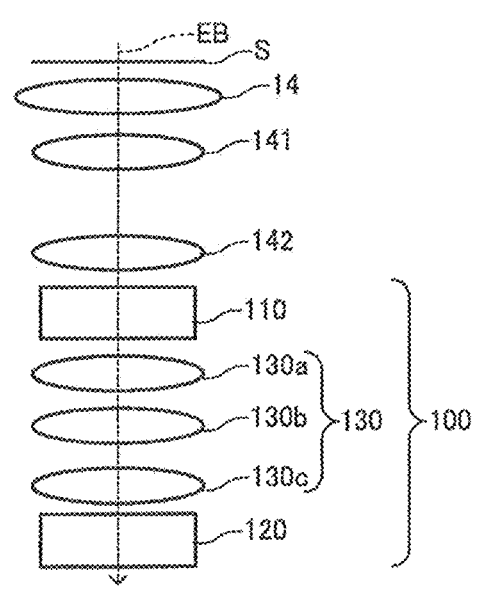
FIG. 2 is a schematic ray diagram showing the optical system of the chromatic aberration corrector shown in FIG. 1.

FIG. 2 shows the optical system of the chromatic aberration corrector 100. As shown, the electron beam, EB, transmitted through a specimen S passes through the objective lens 14 and the objective minilenses 141, 142 and enters the chromatic aberration corrector 100. The objective minilenses 141 and 142 cooperate with the objective lens 14 and intermediate projector lens 16 to constitute the imaging system.

The chromatic aberration corrector 100 is disposed behind the objective lens 14 and objective minilenses 141, 142. The chromatic aberration corrector 100 includes a first multipole element 110 and a second multipole element 120. Furthermore, the corrector 100 can contain a transfer lens 130.

In the chromatic aberration corrector 100, the first multipole element 110, transfer lens 130, and second multipole element 120 are arranged in this order in the direction of travel of the electron beam EB. The electron beam EB enters the first multipole element 110, passes through the transfer lens 130, and exits from the second multipole element 120.

Figure 3A:
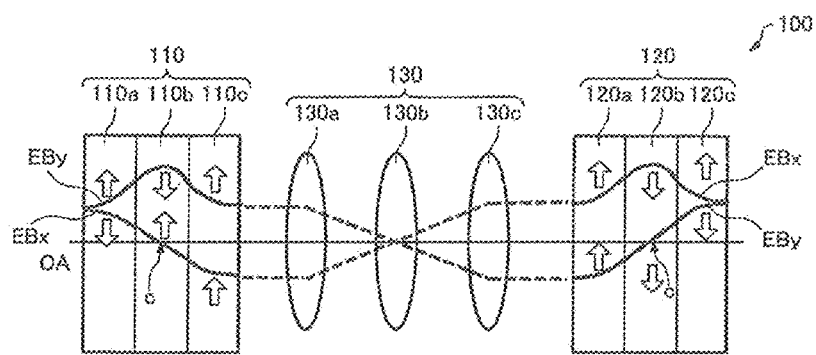
FIG. 3A is a ray diagram showing the configuration of the chromatic aberration corrector shown in FIG. 2.
Figure 3B:
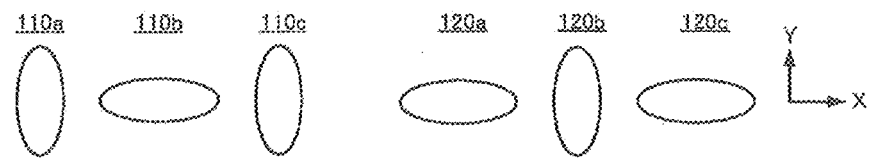
FIG. 3B is a diagram illustrating two-fold astigmatism components in various portions of the chromatic aberration corrector shown in FIG. 2.
Figure 3C:
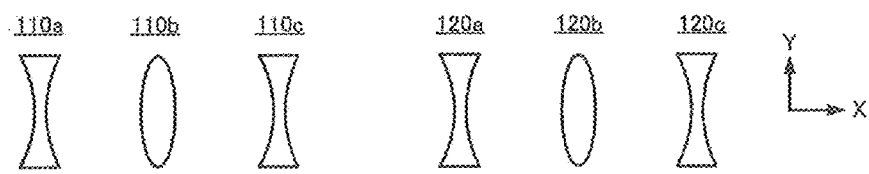
FIG. 3C is a diagram illustrating lens effects produced by various portions of the chromatic aberration corrector shown in FIG. 2.
Figure 3D:
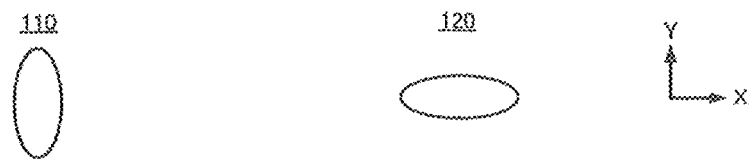
FIG. 3D is a diagram illustrating two-fold chromatic astigmatism components produced by the first and second multipole elements of the chromatic aberration corrector shown in FIG. 2.

FIGS. 3A-3D show the first multipole element 110 and the second multipole element 120 of the chromatic aberration corrector 100. FIG. 3A shows the structure of the chromatic aberration corrector 100. In FIG. 3A, an X orbit EBx is shown as a typical orbit of the electron beam EB in the X-direction. A Y orbit EBy is shown as a typical orbit of the electron beam EB in the Y-direction. X- and Y-axes are perpendicular to the optical axis OA and intersect each other perpendicularly. FIG. 3B shows two-fold astigmatism components in various portions 110a, 110b, 110c, 120a, 120b, and 120c of the multipole elements 110 and 120. FIG. 3C shows lens effects produced in the portions 110a, 110b, 110c, 120a, 120b, and 120c of the multipole elements 110 and 120. FIG. 3D shows two-fold chromatic astigmatism components produced in the first multipole element 110 and second multipole element 120.

As shown in FIG. 3A, the first multipole element 110 is divided into three parts (a first stage (first portion) 110a, a second stage (second portion) 110b, and a third stage (third portion) 110c) along the optical axis OA. The optical axis OA forms the central axes of the multipole elements 110 and 120, respectively. Where each of the multipole elements 110 and 120 is a multipole lens, the optical axis OA is the central axis of the lens. The electron beam EB enters the first portion 110a, passes through the second portion 110b, and exits from the third portion 110c.

The first multipole element 110 produces a first electromagnetic field. Each of the three portions 110a, 110b, and 110c of the first multipole element 110 produces a quadrupole field (electromagnetic field of two-fold symmetry) in which an electric quadrupole field with two-fold symmetry and a magnetic quadrupole field with two-fold symmetry are superimposed. The first electromagnetic field is produced by the quadrupole fields (in each of which electric and magnetic fields are superimposed) generated by the three portions 110a, 110b, and 110c of the first multipole element 110. That is, the first electromagnetic field is formed by the quadrupole fields, in each of which electric and magnetic fields are superimposed, produced by the portions 110a, 110b, and 110c arrayed along the optical axis OA.

The three portions 110a, 110b, and 110c of the first multipole element 110 are hereinafter described in detail.

First, the first portion (first stage) 110a of the first multipole element 110 is described. FIG. 4 is a schematic plan view of the first portion 110a of the first multipole element 110.

The first portion 110a of the first multipole element 110 has a plurality of electrodes and a plurality of magnetic poles arranged regularly around the optical axis OA. In the illustrated example, the first portion 110a has quadrupole electrodes 112a-112d and quadrupole magnetic poles 114a-114d arrayed around the optical axis OA.

The electrodes 112a-112d are angularly spaced from each other by 90 degrees on the XY-plane vertical to the optical axis OA. Voltages applied to the electrodes 112a-112d are equal in absolute value and alternate in polarity. The quadrupole electrodes 112a-112d produce an electric quadrupole field.

The magnetic poles 114a-114d are angularly spaced from each other by 90 degrees on the XY-plane vertical to the optical axis OA. Exciting coils (not shown) whose number of turns is N are mounted on rear end portions (not shown) of the magnetic poles 114a-114d. An electric current I flows through each exciting coil. Accordingly, each magnetic pole has a magnetomotive force NI. The exciting coils are connected with their respective current sources (not shown). Their magnetomotive forces are set to arbitrary values. In the illustrated example, the magnetomotive forces of the magnetic poles 114a-114d are equal to each other in magnitude and alternate in polarity. The quadrupole magnetic poles 114a-114d produce a magnetic quadrupole field.

Figure 6:
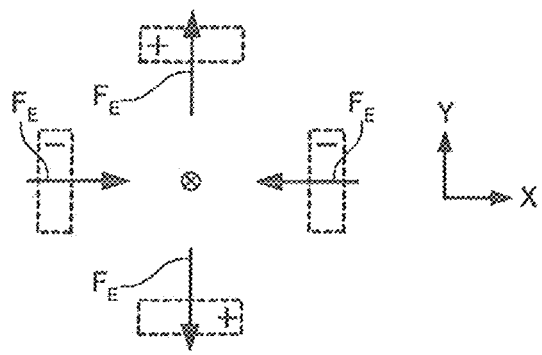
FIG. 6 is a diagram illustrating forces that an electron beam undergoes from an electric quadrupole field produced by quadrupole electrodes.

FIG. 6 illustrates the force that the electron beam EB undergoes from the electric quadrupole field produced by the quadrupole electrodes 112a-112d.

As shown in FIG. 6, the electric quadrupole field produced by the quadrupole electrodes 112a-112d converges the electron beam EB in the X-direction and diverges the beam in the Y-direction. Accordingly, the electron beam EB converges in the X-direction and diverges in the Y-direction by receiving a force $F_E$ from the electric quadrupole field.

Figure 7:
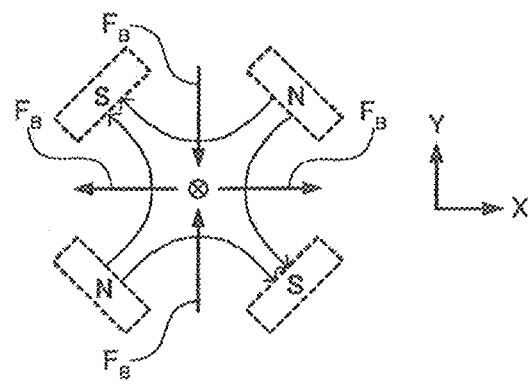
FIG. 7 is a diagram illustrating forces that an electron beam undergoes from a magnetic quadrupole field produced by quadrupole magnetic poles.

FIG. 7 illustrates the force that the electron beam EB undergoes from the magnetic quadrupole field generated by the quadrupole magnetic poles 114a-114d.

As shown in FIG. 7, the magnetic quadrupole field generated by the quadrupole magnetic poles 114a-114d diverges the electron beam EB in the X-direction and converges the beam in the Y-direction. Accordingly, the electron beam EB diverges in the X-direction and converges in the Y-direction by undergoing a force $F_B$ from the magnetic quadrupole field.

In the first portion 110a, an electric quadrupole field and a magnetic quadrupole field are superimposed to generate a quadrupole field. In the first portion 110a, the force $F_E$ that the electron beam EB undergoes from the electric quadrupole field and the force $F_B$ that the beam EB undergoes from the magnetic quadrupole field are applied in mutually canceling directions.

In the first portion 110a, the electric quadrupole field is set stronger than the magnetic quadrupole field. That is, in the first portion 110a, the force $F_E$ that the electron beam EB undergoes from the electric quadrupole field is set greater than the force $F_B$ that the electron beam EB undergoes from the magnetic quadrupole field ($F_B<F_E$). This gives two-fold astigmatism components to the electron beam EB, varying the orbit. More specifically, the first portion 110a gives a two-fold astigmatism divergent component to the Y orbit EBy of the beam EB and a two-fold astigmatism convergent component to the X orbit EBx of the beam EB.

The first portion 110a has a thickness in the direction of travel of the electron beam EB. In particular, the thickness of the first portion 110a is sufficient to generate a combination aberration by fields of higher-order terms other than the primary term of a multipole field. Therefore, a negative chromatic aberration is produced in the first portion 110a by the combination aberrations. As shown in FIG. 3C, the first portion 110a exerts a concave lens action on the electron beam EB by the combination aberrations. That is, the first portion 110a has a concave lens action on the electron beam EB. This principle will be described later.

If an aberration 1 produced at some location propagates a certain distance, the point of incidence varies. When the aberration 1 is affected by another aberration 2, a further aberration, known as a combination aberration, is produced by a combination of aberrations 1 and 2.

The second portion (second stage) 110b of the first multipole element 110 is next described. The second portion 110b is similar in configuration with the first portion 110a shown in FIG. 4. That is, the second portion 110b of the first multipole element 110 has quadrupole electrodes 112a-112d and quadrupole magnetic poles 114a-114d arranged around the optical axis OA.

In the second portion 110b, the magnetic quadrupole field is set stronger than the electric quadrupole field. That is, in the second portion 110b, the force $F_B$ that the electron beam EB undergoes from the magnetic quadrupole field is set greater than the force $F_E$ that the beam EB undergoes from the electric quadrupole field ($F_E<F_B$). Consequently, in the second portion 110b, a two-fold astigmatism component that is opposite in sign to the two-fold astigmatism component generated by the first portion 110a is produced. That is, in the second portion 110b, a quadrupole field directed in the reverse direction to the field in the first portion 110a is applied to the electron beam. More specifically, in the second portion 110b, as shown in FIGS. 3A and 3B, a quadrupole field is produced which gives a two-fold astigmatism convergent component to the Y orbit EBy of the electron beam EB and which gives a two-fold astigmatism divergent component to the X orbit EBx of the beam EB. Consequently, as shown in FIG. 3A, the second portion 110b pushes back the Y orbit EBy having a divergent component to thereby reduce the two-fold astigmatism component and weaken the two-fold astigmatism convergent component of the X orbit EBx.

The second portion 110b has a thickness in the direction of travel of the electron beam EB in the same way as the first portion 110a. Therefore, in the second portion 110b, a negative chromatic aberration is produced by a combination aberration. Furthermore, in the second portion 110b, as shown in FIG. 3C, a convex lens action is exerted on the electron beam EB by a combination aberration. That is, the second portion 110b has a convex lens action on the electron beam EB.

The third portion (third stage) 110c of the first multipole element 110 is next described. The third portion 110c is similar in configuration with the first portion 110a shown in FIG. 4. That is, the third portion 110c of the first multipole element 110 has quadrupole electrodes 112a-112d and quadrupole magnetic poles 114a-114d arranged around the optical axis OA.

In the third portion 110c, the electric quadrupole field is set stronger than the magnetic quadrupole field in the same way as in the first portion 110a. That is, in the third portion 110c, the force $F_E$ that the electron beam EB undergoes from the electric quadrupole field is set greater that the force $F_B$ that the beam EB undergoes from the magnetic quadrupole field ($F_B<F_E$). Consequently, in the third portion 110c, a two-fold astigmatism component is given to the electron beam EB to thereby vary the orbit, in the same way as in the first portion 110a. More specifically, in the third portion 110c, as shown in FIGS. 3A and 3B, a two-fold astigmatism divergent component is given to the Y orbit EBy of the electron beam EB. A two-fold astigmatism convergent component is given to the X orbit EBx of the beam EB. In consequence, the two-fold astigmatism component of the electron beam EB exiting from the first multipole element 110 can be eliminated or reduced.

The third portion 110c has a thickness in the direction of travel of the electron beam EB, in the same way as in the first portion 110a. Therefore, in the third portion 110c, a negative chromatic aberration is produced by a combination aberration. Furthermore, in the third portion 110c, as shown in FIG. 3C, a concave lens action is exerted on the electron beam by a combination of aberrations. That is, the third portion 110c exerts a concave lens action on the electron beam EB.

In the first multipole element 110, the two-fold astigmatism components of the superimposed electric and magnetic fields of the quadrupole fields produced by the first portion 110a and third portion 110c are opposite in sign to the two-fold astigmatism component of the superimposed electric and magnetic fields of the quadrupole field produced by the second portion 110b. In the illustrated example, the quadrupole field of superimposed electric and magnetic fields generated by the first portion 110a is the same as the quadrupole field of the superimposed electric and magnetic fields generated by the third portion 110c. That is, the action exerted on the electron beam by the quadrupole field of superimposed fields produced in the first portion 110a is the same as the action exerted on the electron beam by the quadrupole field of superimposed fields produced in the third portion 110c.

In the first multipole element 110, the X orbit EBx of the electron beam EB crosses the optical axis OA at the center c of the first multipole element 110 as shown in FIG. 3A. Furthermore, in the first multipole element 110, a former portion of the X orbit EBx of the electron beam EB extending from the incident plane to the center c and a latter portion extending from the center c to the exit plane are in point symmetry with respect to the center c. Furthermore, in the first multipole element 110, a former portion of the Y orbit EBy of the electron beam EB extending from the incident plane to the center c and a latter portion extending from the center c to the exit plane are in plane symmetry. In this way, in the first multipole element 110, the orbit of the electron beam EB has good symmetry.

In the first multipole element 110, as shown in FIG. 3A, after the orbits EBx and EBy of the electron beam EB are varied greatly by the first portion 110a, the orbits are returned to the original states by the second portion 110b. Finally, the two-fold astigmatism components are canceled out by the third portion 110c and the electron beam EB is made to exit. Since the orbits EBx and EBy of the beam are varied greatly in the first multipole element 110 in this way, chromatic aberration can be produced at high efficiency.

FIG. 5A is a schematic perspective view of the electrode 112a of the first multipole element 110 of the chromatic aberration corrector 100. FIG. 5B is a schematic perspective view of the magnetic pole 114a of the first multipole element 110 of the chromatic aberration corrector 100.

As shown in FIG. 5A, the electrode 112a of the first multipole element 110 extends from the first portion 110a to the third portion 110c. That is, the electrode 112a is shared among the three portions 110a, 110b, and 110c. The other electrodes 112b-112d of the first multipole element 110 are similar in configuration with the electrode 112a. That is, each of the quadrupole electrodes 112a-112d of the first multipole element 110 extends from the first portion 110a to the third portion 110c. Therefore, the quadrupole electrodes 112a-112d produce uniform electric quadrupole fields in the first portion 110a, second portion 110b, and third portion 110c. Consequently, the electric quadrupole field component of the first electromagnetic field produced by the first multipole element 110 is constant along the optical axis OA.

As shown in FIG. 5B, the magnetic pole 114a of the first multipole element 110 has mutually independent sections which are in the portions 110a, 110b, and 110c, respectively. The other magnetic poles 114b-114d of the first multipole element 110 are similar in configuration with the magnetic pole 114a. In the first multipole element 110, therefore, magnetic quadrupole fields of different strengths can be produced in the portions 110a, 110b, and 110c, respectively. The first electromagnetic field is produced in the first multipole element 110 by making the electric quadrupole field uniform among the portions 110a, 110b, and 110c and making the magnetic quadrupole field different among the three portions. Specifically, in the first multipole element 110, the electric quadrupole field is made uniform in strength among the portions 110a, 110b, and 110c. The magnetic quadrupole field in the second portion 110b is set stronger than the magnetic quadrupole fields in the first portion 110a and third portion 110c.

The magnetic poles 114a-114d may be made common among the portions 110a, 110b, and 110c of the first multipole element 110 and the electrodes 112a-112d may be made independent. In this configuration, the first electromagnetic field can be produced by making the magnetic quadrupole field uniform among the three portions 110a, 110b, and 110c of the first multipole element 110 and making the electric quadrupole field different among these three portions. In addition, the magnetic poles 114a-114d and electrodes 112a-112d may be made independent in the three portions 110a, 110b, and 110c of the first multipole element 110.

The second multipole element 120 produces a second electromagnetic field that is angularly shifted with respect to the first electromagnetic field by 90 degrees about the optical axis OA. That is, in the second multipole element 120, the electric and magnetic fields are so set that the X orbit EBx and the Y orbit EBy are symmetrical with respect to the first multipole element 110 as shown in FIG. 3A. Consequently, as shown in FIG. 3D, the two-fold chromatic astigmatism component produced in the first multipole element 110 can be canceled out by the two-fold chromatic astigmatism component produced in the second multipole element 120. Accordingly, the whole chromatic aberration corrector 100 can be made free from two-fold chromatic aberration component.

As shown in FIG. 3A, the second multipole element 120 is divided into three portions, i.e., the first stage (first portion) 120a, the second stage (second portion) 120b, and the third stage (third portion) 120c, along the optical axis OA. In the second multipole element 120, the electron beam EB enters the first portion 120a, passes through the second portion 120b, and exits from the third portion 120c. Each of the three portions 120a, 120b, and 120c of the second multipole element 120 produces a quadrupole field by superimposing an electric quadrupole field and a magnetic quadrupole field on each other. As a result, a second electromagnetic field is set up by the quadrupole fields of superimposed electric and magnetic fields produced by the three portions 120a-120c of the second multipole element 120. That is, the second electromagnetic field is generated by the quadrupole fields of superimposed electric and magnetic fields created by the portions 120a, 120b, and 120c arrayed along the optical axis OA.

The three portions 120a, 120b, and 120c of the second multipole element 120 are hereinafter described in detail.

Figure 8:
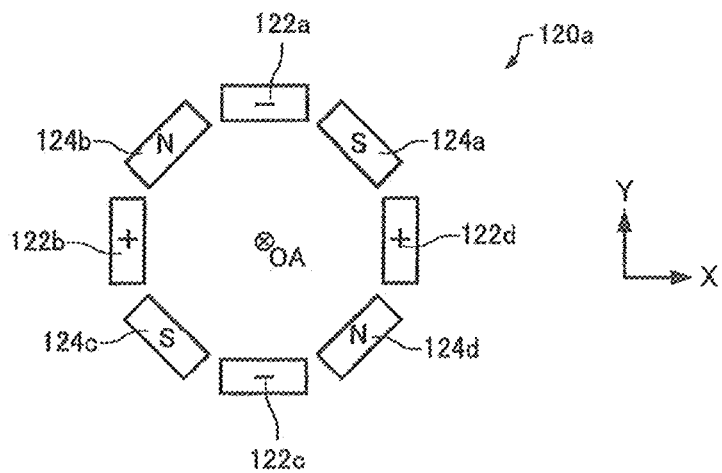
FIG. 8 is a schematic plan view of a first portion of a second multipole element of the chromatic aberration corrector shown in FIG. 2.

The first portion (first stage) 120a of the second multipole element 120 is first described. FIG. 8 is a schematic plan view of the first portion 120a of the second multipole element 120.

The first portion 120a of the second multipole element 120 has a plurality of electrodes and a plurality of magnetic poles arranged regularly around the optical axis OA. In the illustrated example, the first portion 120a of the second multipole element 120 has quadrupole electrodes 122a-122d and quadrupole magnetic poles 124a-124d arrayed around the optical axis OA.

The electrodes 122a-122d are angularly spaced from each other by 90 degrees on the XY-plane perpendicular to the optical axis OA. Voltages applied to the electrodes 122a-122d are equal in absolute value and alternate in polarity. The quadrupole electrodes 122a-122d produce an electric quadrupole field.

The magnetic poles 124a-124d are angularly spaced from each other by 90 degrees on the XY-plane perpendicular to the optical axis OA. Exciting coils (not shown) whose number of turns is N are mounted on rear end portions (not shown) of the magnetic poles 124a-124d. An electric current I flows through each exciting coil. Accordingly, each magnetic pole has a magnetomotive force NI. The exciting coils are connected with their respective current sources (not shown). Their magnetomotive forces are set to arbitrary values. In the illustrated example, the magnetomotive forces of the magnetic poles 124a-124d are equal to each other in magnitude and alternate in polarity. The quadrupole magnetic poles 124a-124d produce a magnetic quadrupole field.

The electrodes 122a-122d and magnetic poles 124a-124d of the first portion 120a of the second multipole element 120 are similar in physical arrangement with the first portion 110a (FIG. 4) of the first multipole element 110 but opposite in polarity as shown in FIG. 8. That is, the polarities of the second multipole element 120 are angularly shifted by 90 degrees with respect to the polarities of the first multipole element 110.

In the first portion 120a, the electric quadrupole field is set stronger than the magnetic quadrupole field. That is, in the first portion 120a, the force $F_E$ (FIG. 6) that the electron beam EB undergoes from the electric quadrupole field is set stronger than the force $F_B$ (FIG. 7) that the beam EB undergoes from the magnetic quadrupole field ($F_B<F_E$). Consequently, a two-fold astigmatism component is given to the electron beam EB, thus varying the orbit. More specifically, as shown in FIGS. 3A and 3B, in the first portion 120a, a two-fold astigmatism divergent component is given to the X orbit EBx of the beam EB and a two-fold astigmatism convergent component is given to the Y orbit EBy of the beam EB. The quadrupole field of superimposed electric and magnetic fields produced by the first portion 120a of the second multipole element 120 is angularly shifted by 90 degrees about the optical axis OA with respect to the quadrupole field of superimposed electric and magnetic fields produced by the first portion 110a of the first multipole element 110.

The first portion 120a has a thickness in the direction of travel of the electron beam EB. More specifically, the first portion 120a is thick enough to produce a combination aberration by the fields of high-order terms of the multipole field other than the primary term. Therefore, in the first portion 120a, a negative chromatic aberration is produced by a combination aberration. Furthermore, the first portion 120a exerts a concave lens action on the electron beam by a combination aberration. That is, the first portion 120a produces a concave lens action on the electron beam EB.

The second portion (second stage) 120b of the second multipole element 120 is next described. The second portion 120b is similar in configuration with the first portion 120a shown in FIG. 8. That is, the second portion 120b of the second multipole element 120 has quadrupole electrodes 122a-122d and quadrupole magnetic poles 124a-124d arranged around the optical axis OA.

In the second portion 120b, the magnetic quadrupole field is set stronger than the electric quadrupole field. That is, in the second portion 120b, the force $F_B$ that the electron beam EB undergoes from the magnetic quadrupole field is set greater than the force $F_E$ that the electron beam EB undergoes from the electric quadrupole field ($F_E<F_B$). Consequently, the second portion 120b produces a two-fold astigmatism component that is opposite in sign to the two-fold astigmatism component produced in the first portion 120*a*. That is, the second portion 120*b* applies a quadrupole field, which is opposite in sense from the field produced by the first portion 120*a*, to the electron beam. More specifically, as shown in FIGS. 3A and 3B, the second portion 120*b* produces a quadrupole field which gives a two-fold astigmatism convergent component to the X orbit EBx of the electron beam EB and which gives a two-fold astigmatism divergent component to the Y orbit EBy of the beam EB. Consequently, as shown in FIG. 3A, the second portion 120*b* pushes back the X orbit EBx having a divergent component to thereby reduce the two-fold astigmatism component and weakens the convergent component of the two-fold astigmatism of the Y orbit EBy. The quadrupole field of superimposed electric and magnetic fields produced by the second portion 120*b* of the second multipole element 120 is angularly shifted by 90 degrees about the optical axis OA with respect to the quadrupole field of superimposed electric and magnetic fields produced by the second portion 110*b* of the first multipole element 110.

The second portion 120*b* has a thickness in the direction of travel of the electron beam EB in the same way as the first portion 120*a*. Therefore, in the second portion 120*b*, a negative chromatic aberration is produced by a combination aberration. Furthermore, as shown in FIG. 3C, the second portion 120*b* produces a convex lens action on the electron beam EB by a combination aberration. That is, the second portion 120*b* has a convex lens action on the electron beam EB.

The third portion (third stage) 120*c* of the second multipole element 120 is next described. The third portion 120*c* is similar in configuration with the first portion 120*a* shown in FIG. 8. That is, the third portion 120*c* of the second multipole element 120 has quadrupole electrodes 122*a*-112*d* and quadrupole magnetic poles 124*a*-124*d* arrayed around the optical axis OA.

In the third portion 120*c*, the electric quadrupole field is set stronger than the magnetic quadrupole field in the same way as in the first portion 120*a*. That is, in the third portion 120*c*, the force $F_E$ that the electron beam EB undergoes from the electric quadrupole field is set greater than the force $F_B$ that the beam EB undergoes from the magnetic quadrupole field ($F_B < F_E$). Consequently, the third portion 120*c* gives a two-fold astigmatism component to the electron beam EB, thus varying the orbit, in the same way as the first portion 120*a*. More specifically, the third portion 120*c* gives a two-fold astigmatism divergent component to the X orbit EBx of the electron beam EB and gives a two-fold astigmatism convergent component to the Y orbit EBy of the beam EB. As a result, the two-fold astigmatism component of the electron beam EB emitted from the second multipole element 120 can be eliminated or reduced. The quadrupole field of superimposed electric and magnetic fields produced by the third portion 120*c* of the second multipole element 120 is angularly shifted by 90 degrees about the optical axis OA with respect to the quadrupole field of superimposed electric and magnetic fields produced by the third portion 110*c* of the first multipole element 110.

The third portion 120*c* has a thickness in the direction of travel of the electron beam EB in the same way as the first portion 120*a*. Therefore, in the third portion 120*c*, a negative chromatic aberration is produced by a combination aberration. The third portion 120*c* exerts a concave lens action on the electron beam by a combination aberration. That is, the third portion 120*c* has a concave lens action on the electron beam EB.

In the second multipole element 120, the two-fold astigmatism components of the quadrupole fields of superimposed electric and magnetic fields produced by the first portion 120*a* and third portion 120*c* are opposite in sign to the two-fold astigmatism component of the quadrupole field of superimposed electric and magnetic fields produced by the second portion 120*b*. In the illustrated example, the quadrupole field of superimposed electric and magnetic fields produced by the first portion 120*a* is the same as the quadrupole field of superimposed electric and magnetic fields produced by the third portion 120*c*. That is, the action exerted on the electron beam by the quadrupole field of superimposed electric and magnetic fields produced by the first portion 120*a* is the same as the action exerted on the electron beam by the quadrupole field of superimposed electric and magnetic fields produced by the third portion 120*c*.

As shown in FIG. 3A, in the second multipole element 120, the Y orbit EBy of the electron beam EB intersects the optical axis OA at the center c of the second multipole element 120. Furthermore, in the second multipole element 120, the Y orbit EBy of the electron beam EB is symmetrical with respect to the center c. That is, a former portion of the Y orbit EBy extending from the incident plane to the center c and a latter portion from the center c to the exit plane are in point symmetry. In the second multipole element 120, a former portion of the X orbit EBx of the electron beam EB which extends from the incident plane to the center c and a latter portion extending from the center c to the exit plane are in plane symmetry. In this way, in the second multipole element 120, the orbit of the electron beam EB has good symmetry.

As shown in FIG. 3A, in the second multipole element 120, after the orbits EBx and EBy of the electron beam are varied greatly by the first portion 120*a*, the orbits are returned to their original states by the second portion 120*b*. Finally, the two-fold astigmatism components are canceled out by the third portion 120*c*. Then, the electron beam EB is made to exit. In this way, in the second multipole element 120, the orbits EBx and EBy of the electron beam are varied greatly. Consequently, chromatic aberration can be produced efficiently.

The second multipole element 120 produces the first electromagnetic field by making the electric quadrupole field uniform among the portions 120*a*, 120*b*, and 120*c* and making the magnetic quadrupole field different among these three portions, in the same way as the first multipole element 110. The magnetic poles 124*a*-124*d* may be shared among the portions 120*a*, 120*b*, and 120*c* of the second multipole element 120, and the electrodes 122*a*-122*d* may be made independent. In consequence, the first electromagnetic field can be produced by making the magnetic quadrupole field uniform among the portions 120*a*, 120*b*, and 120*c* of the second multipole element 120 and making the electric quadrupole field different among these three portions. In the portions 120*a*, 120*b*, and 120*c* of the second multipole element 120, the magnetic poles 124*a*-124*d* and electrodes 122*a*-122*d* may be made independent.

The transfer lens 130 is disposed between the first multipole element 110 and the second multipole element 120. In the illustrated example, the transfer lens 130 is composed of three lens elements 130*a*, 130*b*, and 130*c*. For example, the transfer lens 130 is a lens with a transfer magnification of 1:1. A reciprocal space image created in the first multipole element 110 is transferred to the second multipole element 120 by the transfer lens 130. The transfer lens 130 is so disposed that a deviation occurs from an arrangement where the center of the first multipole element 110 is completely transferred to the center of the second multipole element 120 and that there is no two-fold astigmatism component at the exit (exit plane) of the second multipole element 120. The transfer lens 130 may also be made of a pair of lens elements in an unillustrated manner.

1.2. Operation of Chromatic Aberration Corrector

Figure 9:
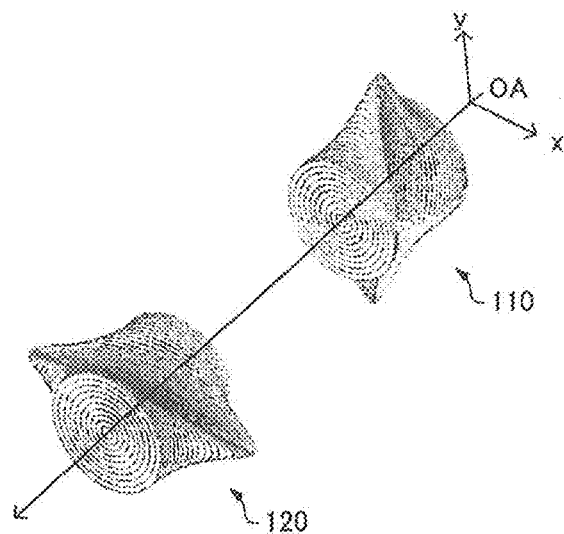
FIG. 9 is an electron ray diagram illustrating orbits of an electron beam within the first and second multipole elements of the chromatic aberration corrector shown in FIG. 2.

The operation of the chromatic aberration corrector 100 associated with the first embodiment is next described. FIG. 9 schematically shows the orbit of the electron beam within the first multipole element 110 and second multipole element 120 of the chromatic aberration corrector 100. In FIG. 9, each circle indicates an orbit of the electron beam in each angular range of 10 mrad. The operation is further described by referring to FIGS. 3A and 9.

In the first portion 110a of the first multipole element 110, the electric quadrupole field is set stronger than the magnetic quadrupole field. Consequently, the electron beam EB impinging on the first portion 110a has a two-fold astigmatism component, thus varying the orbit. In particular, in the first portion 110a, the Y orbit EBy of the beam EB has a divergent component of two-fold astigmatism and the X orbit EBx has a convergent component of two-fold astigmatism.

In the second portion 110b, the magnetic quadrupole field is set greater than the electric quadrupole field. Consequently, in the second portion 110b, the Y orbit EBy having a divergent component is pushed back, reducing the two-fold astigmatism component. The convergent component of the two-fold astigmatism component of the X orbit EBx weakens and the X orbit passes through the center c of the first multipole element 110. On the X orbit EBx, as shown in FIGS. 3A and 9, the orbit on the +X axis side and the orbit on the −X axis side intersect at the center c of the first multipole element 110.

In the third portion 110c, the electric quadrupole field is set greater than the magnetic quadrupole field. Consequently, in the third portion 110c, the two-fold astigmatism component of the electron beam EB is finally canceled out. As a result, the electron beam EB emerging from the third portion 110c of the first multipole element 110 has no two-fold astigmatism component as shown in FIG. 9. The beam EB ejected from the first multipole element 110 enters the transfer lens 130.

The reciprocal space image created in the first multipole element 110 is transferred to the second multipole element 120 through the transfer lens 130. Since the electron beam EB emerging from the first multipole element 110 has no two-fold astigmatism component, the beam EB can be made to impinge proximally on the center of the transfer lens 130.

In the second multipole element 120, an electromagnetic field is produced such that the X orbit EBx of the electron beam EB in the second multipole element 120 and the X orbit EBx of the beam EB in the first multipole element 110 are symmetrical with each other and that the Y orbit EBy of the beam EB in the second multipole element 120 and the Y orbit EBy of the beam EB in the first multipole element 110 are symmetrical with one another. That is, the electromagnetic field produced by the second multipole element 120 is angularly shifted about the optical axis OA by 90 degrees with respect to the electromagnetic field produced by the first multipole element 110. Consequently, in the second multipole element 120, the two-fold chromatic astigmatism component produced in the first multipole element 110 is canceled out by the chromatic two-fold astigmatism component produced in the second multipole element 120. As shown in FIG. 9, the orbit of the electron beam in the second multipole element 120 is angularly shifted by 90 degrees about the optical axis OA with respect to the orbit of the electron beam in the first multipole element 110.

Negative chromatic aberrations are produced in the portions 110a, 110b, 110c, 120a, 120b, and 120c of the multipole elements 110 and 120 by combinations of aberrations. Accordingly, in the whole chromatic aberration corrector 100, a negative chromatic aberration is produced. As a consequence, the positive chromatic aberration in the objective lens 14 can be canceled out by the negative chromatic aberration in the chromatic aberration corrector 100.

1.3. Principles

The principle on which a concave lens effect is produced by a combination of aberrations in quadrupole fields having thicknesses in the direction of travel of an electron beam is next described. Also, the principle on which two-fold chromatic astigmatism can be canceled out by the second multipole element 120 is described.

For example, a quadrupole element and a hexapole element fundamentally produce a two-fold symmetric field and a three-fold symmetric field, respectively. When a field produced by such a multipole element is expanded into multiple terms by a multipole expansion technique, those symmetric fields are known as the primary terms. An actual multipole element produces slight amounts of fields due to higher order terms other than the primary term. In a usually employed multipole element having no or slight thickness, higher order terms other than the primary term are neglected in the intended application of the multipole element or are merely parasitic parameters. However, if the thickness of the multipole element is increased, higher order terms other than the primary term exhibit effects. A multipole element having a required length in the direction of travel of the electron beam to make use of the effects is a multipole element having a "thickness". Fields produced by the multipole element have "thicknesses".

Two-fold astigmatism caused by a static electric or magnetic field produced by a quadrupole element or by superimposed static electric and magnetic fields (two-fold symmetric field) is now discussed. In calculating the orbit of an electron beam using a complex representation, let r be a position in a reciprocal space (focal plane). Let r' ($=\partial r/\partial z$) be a tilt. Let $\Omega$ be a complex angle. Let $\Omega$' ($=\partial \Omega/\partial z$) be a derivative of a complex angle. Assuming that $A_2$ is a two-fold astigmatism coefficient per unit length, a two-fold astigmatism (geometric aberration) is given by the following formula using a complex conjugate of $A_2$ and $\Omega$.

$$A_2 \overline{\Omega}$$

where $\overline{\Omega}$ is a complex conjugate of $\Omega$.

A complex representation of a position $r_0$ and a tilt $r_0$' of an electron beam at the incident surface of a quadrupole element is given by $$\begin{pmatrix} r_0 \\ r'_0 \end{pmatrix}$$

A complex representation of another position $r_1$ and another tilt $r_1$' of the electron beam at the incident surface of the quadrupole element is given by $$\begin{pmatrix} r_1 \\ r'_1 \end{pmatrix}$$

Let f be the focal distance of an objective lens. If a specimen plane exists within this objective lens, and if the position and tilt of the electron beam at this position are represented in terms of a reciprocal space, they are given by r=f$\Omega$ and r'=f$\Omega$', respectively.

Let t be the thickness of the multipole element in the direction of travel of the electron beam. The tilt of the electron beam at the exit surface of this multipole element is given by $$r'_1 = r'_0 + \sum_{n=1} \frac{\Omega_0}{(4n-1)! f^{4n-1}} |A_2|^{2n} t^{4n-1} + \qquad (1)$$

$$\sum_{n=1} \frac{\Omega'_0}{(4n)! f^{4n-1}} |A_2|^{2n} t^{4n} - \sum_{n=1} \frac{\overline{\Omega_0}}{(4n-3)! f^{4n-3}} A_2 \cdot |A_2|^{2(n-1)} t^{4n-3} -$$

$$\sum_{n=1} \frac{\overline{\Omega'_0}}{(4n-2)! f^{4n-3}} A_2 \cdot |A_2|^{2(n-1)} t^{4n-2}$$

where n is an integer (n>0).

In Eq. (1), the term having the coefficient $|A_2|^{2n}$ represents a lens action in cylindrical symmetry. Each term of positive sign (+) indicates a concave lens action. An effect produced by this action is also known as "a divergent focusing effect of the cylindrical symmetry type". On the other hand, each term having the coefficient $A_2 \cdot |A_2|^{2(n-1)}$ represents a two-fold astigmatism.

Let $A_{E2}$ be a two-fold astigmatism coefficient produced by an electric quadrupole field (electric field of two-fold symmetry). The strength $|A_{E2}|$ of the electric quadrupole field is given by $$|A_{E2}| \propto \frac{1}{U} \qquad (2)$$

where U is an accelerating voltage.

Let $A_{B2}$ be a two-fold astigmatism coefficient produced by a magnetic quadrupole field (magnetic field of two-fold symmetry). The strength $|A_{B2}|$ of the magnetic quadrupole field is given by $$|A_{B2}| \propto \frac{1}{\sqrt{U}} \qquad (3)$$

In an optical system having a concave lens action produced by a quadrupole field having a thickness, the indexes of the coefficient $|A_2|$ of Eq. (1) are 2n and 2(n-1). If this is taken into consideration, the dependence of the deflecting force of the optical system on the accelerating voltage can be set to be in proportion to $1/U^N$ (where N is a positive integer) because of a combination of terms associated with the coefficient $|A_2|$.

Furthermore, in an optical system where the electric deflecting force and magnetic deflecting force on an electron beam with a given accelerating voltage are canceled out, the coefficient $|A_2|$ has a finite value for an electron beam with an accelerating voltage different from the given accelerating voltage. Consequently, the electron beam undergoes a concave lens action.

Where the objective lens having the focal distance of f shown in Eq. (1) is of the magnetic type, the deflecting force of this objective lens is given by $$\frac{1}{f} \propto \frac{1}{U} \qquad (4)$$

As described previously, the dependence of the deflecting force produced by a quadrupole field having a thickness on accelerating voltage is given by $1/U^N$. On the other hand, the dependence of the deflecting force produced by an objective lens as given by Eq. (4) on accelerating voltage is given by 1/U. That is, these two types of dependence on accelerating voltage are different greatly and so a quadrupole field having a thickness has a refractive index different from that of an objective lens. Because of this difference, it can be seen that a concave lens action of a quadrupole field having a thickness can be used to correct chromatic aberration in the objective lens.

If the thickness t of the quadrupole element is increased, the concave lens action becomes stronger as given by Eq. (1). Accordingly, it is possible to determine the thickness t in conformity with the required strength of concave lens action.

New two-fold astigmatisms are produced in a single stage of quadrupole field as given by the terms of the right side of Eq. (1) having coefficient $A_2 \cdot |A_2|^{2(n-1)}$. However, these two-fold astigmatisms can be removed by providing two stages of quadrupoles as given below. Two-fold symmetric fields produced by the two stages of quadrupoles, respectively, are made analogous and antisymmetric. Specifically, two multipole elements of the same structure are disposed, and voltages of opposite polarities are applied to the multipole elements. Alternatively, the multipole elements are excited with currents having opposite polarities. Assuming that the thicknesses of the quadrupole elements taken along the optical axis are the same, the tilt $r_2'$ of the electron beam at the exit surface of the second stage of quadrupole element is given by $$r'_2 = -2 \sum_{n=1} \frac{\Omega_0}{(4n-1)! f^{4n-1}} |A_2|^{2n} t^{4n-1} + \qquad (5)$$

$$\sum_{n=1} \sum_{m=1} \left[ \frac{16mn - 4n - 4m}{(4n)!(4m)!} \right] \frac{\Omega_0}{f^{4n+4m-1}} |A_2|^{2n+2m} t^{4n+4m-1} +$$

$$\sum_{n=1} \sum_{m=1} \left[ \frac{-16mn + 12n + 12m - 8}{(4n-2)!(4m-2)!} \right] \frac{\Omega_0}{f^{4n+4m-5}} |A_2|^{2n+2m-2} t^{4n+4m-5}$$

where n and m are positive integers.

If two stages of quadrupole elements are arranged with opposite polarities as given by Eq. (5), the term having coefficient $A_2 \cdot |A_2|^{2(n-1)}$ of two-fold astigmatism shown in Eq. (1) disappears. Since terms having positive sign (+) of the right side of this equation show a concave lens action, only a lens action in cylindrical symmetry necessary for aberration correction can be extracted. In this way, the concave lens action of the two stages of quadrupole elements each having a thickness can correct chromatic aberration in the objective lens without producing two-fold astigmatism.

The chromatic aberration corrector 100 associated with the first embodiment and the electron microscope 10 have the following features.

In the chromatic aberration corrector 100, the first multipole element 110 has the first portion 110a, the second portion 110b, and the third portion 110c arranged along the optical axis OA. Each of the three portions 110a-110c has a thickness in the direction of travel of the electron beam EB. Consequently, the first portion 110a and the third portion 110c of the first multipole element 110 can produce concave lens effects by a combination of aberrations in quadrupole fields each having a thickness in the direction of travel of the electron beam. The second portion 110b of the first multipole element 110 can produce a convex lens effect by a combination of aberrations in quadrupole fields each having a thickness in the direction of travel of the electron beam.

The portions 110a, 110b, and 110c of the first multipole element 110 produce quadrupole fields of superimposed electric and magnetic quadrupole fields. Consequently, a greater negative chromatic aberration can be obtained than where a quadrupole field is produced using an electric or magnetic quadrupole field alone.

In the first portion 110a of the first multipole element 110 of the chromatic aberration corrector 100, the electric quadrupole field is set stronger than the magnetic quadrupole field. In the second portion 110b, the magnetic quadrupole field is set stronger than the electric quadrupole field. In the third portion 110c, the electric quadrupole field is set stronger than the magnetic quadrupole field. The two-fold astigmatism component produced in the second portion 110b is opposite in sign to the two-fold astigmatism components produced in the first portion 110a and third portion 110c. Consequently, the electron beam EB free from two-fold astigmatism components can be produced from the first multipole element 110. Therefore, the electron beam EB can be made to impinge proximally on the center of the transfer lens 130. Thus, with the chromatic aberration corrector 100, the effects of aberrations in the transfer lens 130 can be reduced. Alignments can be made easily.

For example, where an electron beam having two-fold astigmatism is ejected from the first multipole element, the beam is spread by the transfer lens located between the first and second multipole elements. Generally, if an electron beam passes through an end of a lens, large aberration is introduced. Therefore, if an electron beam having two-fold astigmatism is emitted from the first multipole element, large aberration may be induced in the beam by the transfer lens. This will make it difficult to make alignments or complicate alignment operations. The chromatic aberration corrector 100 makes it possible to produce the electron beam EB free from two-fold astigmatism components from the first multipole element 110 and, therefore, the effects of aberrations in the transfer lens 130 can be reduced. It is easier to make alignments.

Furthermore, in the first multipole element 110, the orbits EBx and EBy of the electron beam can be varied greatly through the three portions (three stages) 110a, 110b, and 110c. Therefore, chromatic aberration can be produced more efficiently than where a single stage of multipole element is used. This makes it possible to shorten the thickness of the first multipole element 110, taken in the direction of travel of the electron beam. For example, in a multipole element, field charging and quite slight voltage instability are major causes leading to a deterioration of the final resolution of the electron microscope. As the thickness of a multipole element taken in the direction of travel of the electron beam increases, an electric field is subjected to these noise components over an increased distance, whereby the electron beam is disturbed to a greater extent. Accordingly, the resolution can be improved by reducing the thickness of the multipole element. In the chromatic aberration corrector 100, the first multipole element 110 can be shortened as described previously. Hence, the resolution of the electron microscope 10 can be improved.

In the chromatic aberration corrector 100, the second electromagnetic field produced by the second multipole element 120 is angularly shifted by 90 degrees about the optical axis with respect to the first electromagnetic field produced by the first multipole element 110. In consequence, the two-fold chromatic astigmatism component produced in the first multipole element 110 can be canceled out by the two-fold chromatic astigmatism component produced in the second multipole element 120. As a result, in the whole chromatic aberration corrector 100, two-fold chromatic astigmatism components can be eliminated.

In the chromatic aberration corrector 100, the electric quadrupole field component of the first electromagnetic field produced by the first multipole element 110 is constant along the optical axis OA. Thus, the electric quadrupole field can be produced by a simple structure.

In the chromatic aberration corrector 100, the first multipole element 110 has the plural electrodes 112a-112d extending from the first portion 110a to the third portion 110c. The electrodes 112a-112d produce uniform electric quadrupole fields in the first portion 110a, second portion 110b, and third portion 110c. In this way, the chromatic aberration corrector 100 can produce electric quadrupole fields with a simple structure.

In the electron microscope 10, the chromatic aberration corrector 100 can correct aberrations by producing negative chromatic aberrations efficiently. Accordingly, in the electron microscope 10, the length or thickness of the first multipole element 110 can be reduced and thus the resolution can be improved. Furthermore, in the electron microscope 10, alignments can be made easily because it is equipped with the chromatic aberration corrector 100.

1.4. Modifications

Modifications of the chromatic aberration corrector associated with the first embodiment are next described with reference to some drawings.

(1) First Modification

Figure 10:
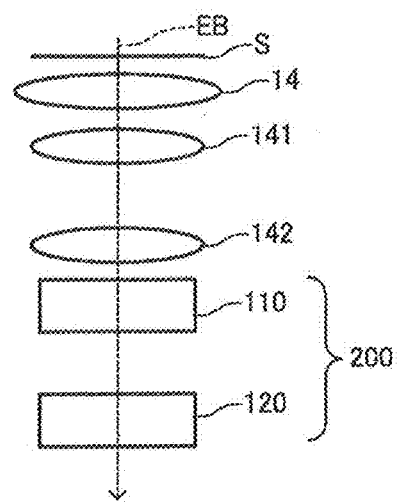
FIG. 10 is a schematic ray diagram illustrating the optical system of a chromatic aberration corrector associated with a first modification of the first embodiment.
Figure 11A:
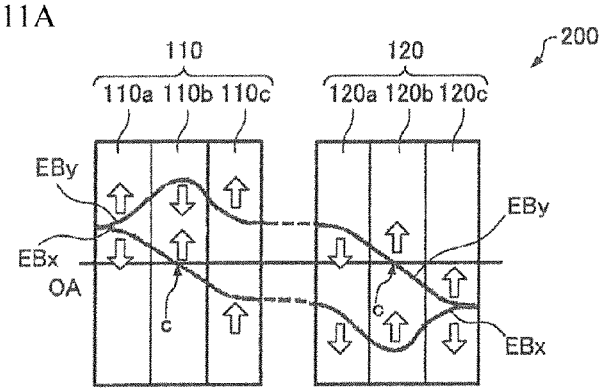
FIG. 11A is a ray diagram illustrating the configuration of the chromatic aberration corrector shown in FIG. 10.
Figure 11B:
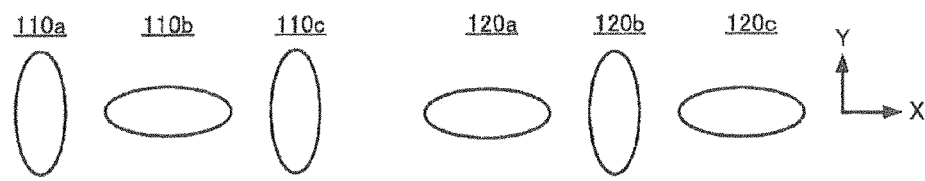
FIG. 11B is a diagram illustrating two-fold astigmatism components in various portions of the chromatic aberration corrector shown in FIG. 10.
Figure 11C:
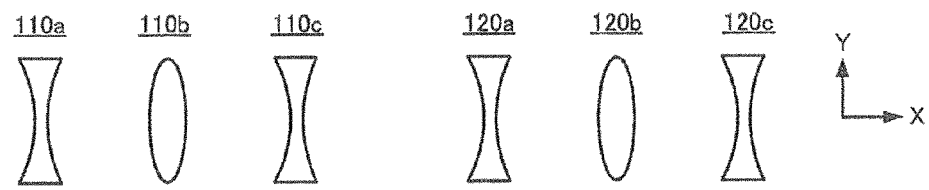
FIG. 11C is a diagram illustrating lens effects produced in various portions of the chromatic aberration corrector shown in FIG. 10.
Figure 11D:
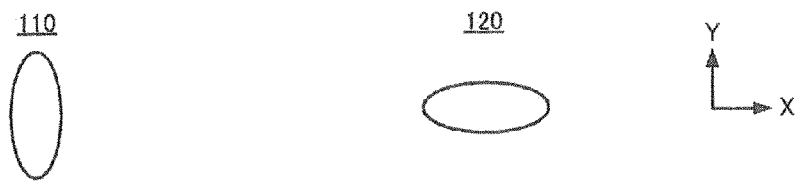
FIG. 11D is a diagram illustrating two-fold chromatic astigmatism components produced in the first and second multipole elements of the chromatic aberration corrector shown in FIG. 10.

A first modification is described. FIG. 10 shows the optical system of a chromatic aberration corrector, 200, associated with the first modification. FIGS. 11A-11D show a first multipole element 110 and a second multipole element 120 of the chromatic aberration corrector 200. FIG. 11A shows the configuration of the chromatic aberration corrector 200. In FIG. 11A, an X orbit EBx is shown as a typical orbit of an electron beam EB in the X-direction. A Y orbit EBy is shown as a typical orbit of the beam EB in the Y-direction. FIG. 11B shows two-fold astigmatism components in various portions 110a, 110b, 110c, 120a, 120b, and 120c of the multipole elements 110 and 120. FIG. 11C shows lens effects produced in the various portions 110a, 110b, 110c, 120a, 120b, and 120c of the multipole elements 110 and 120. FIG. 11D shows two-fold chromatic astigmatism components produced in the first multipole element 110 and second multipole element 120. Those members of the chromatic aberration corrector 200 which are similar in function with their respective counterparts of the aforementioned chromatic aberration corrector 100 are indicated by the same reference numerals as in the above-cited figures and a detail description thereof is omitted.

The above-described chromatic aberration corrector 100 is configured including the first multipole element 110, the second multipole element 120, and the transfer lens 130 disposed between the first multipole element 110 and the second multipole element 120 as shown in FIGS. 2 and 3.

In contrast, the chromatic aberration corrector 200 is configured including the first multipole element 110 and the second multipole element 120 as shown in FIGS. 10 and 11. That is, in the chromatic aberration corrector 200, the transfer lens 130 is not disposed between the first multipole element 110 and the second multipole element 120. The distance between the first multipole element 110 and the second multipole element 120 is so set that off-axis aberrations are reduced. In other respects, the chromatic aberration corrector 200 is similar in configuration with the chromatic aberration corrector 100 and a description of such similar parts is omitted.

The chromatic aberration corrector 200 can yield the same advantageous effects as the aforementioned chromatic aberration corrector 100.

(2) Second Modification

Figure 12:
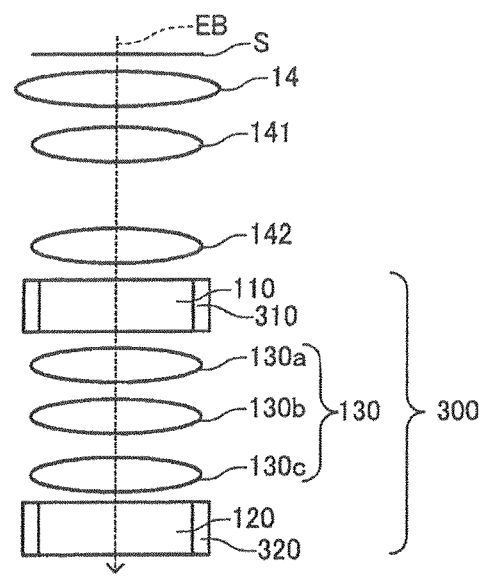
FIG. 12 is a schematic ray diagram illustrating the optical system of a chromatic aberration corrector associated with a second modification of the first embodiment.

A second modification is next described. FIG. 12 shows the optical system of a chromatic aberration corrector, 300, associated with the second embodiment. Those members of the chromatic aberration corrector 300 which are similar in function with their respective counterparts of the aforementioned chromatic aberration corrector 100 are indicated by the same reference numerals as in the above-cited figures and a detail description thereof is omitted.

The chromatic aberration corrector 300 includes a third multipole element 310 for superimposing an electric field of 4-fold symmetry on the first electromagnetic field produced by the first multipole element 110 and a fourth multipole element 320 for superimposing an electric field of 4-fold symmetry on the second electromagnetic field produced by the second multipole element 120. Consequently, the chromatic aberration corrector 300 can correct spherical aberration in addition to chromatic aberration.

The third multipole element 310 superimposes the electric field of 4-fold symmetry on the quadrupole field of superimposed electric and magnetic fields produced by the second portion 110b (FIG. 3) of the first multipole element 110. The fourth multipole element 320 superimposes the electric field of 4-fold symmetry on the quadrupole field of superimposed electric and magnetic fields produced by the second portion 120b of the second multipole element 120. For example, each of the third multipole element 310 and fourth multipole element 320 is an octopole element.

Where the electron beam EB has two-fold astigmatism, if a four-fold symmetric field is superimposed on it, a negative spherical aberration $-C_s$ is produced as given below.

$$-C_s \propto A_2^2 \cdot A_4 \qquad (6)$$

where $A_2$ is a two-fold astigmatism coefficient and $A_4$ is a four-fold astigmatism coefficient. Chromatic aberration and spherical aberration can be corrected simultaneously by superimposing an astigmatic field of four-fold symmetry in this way.

The chromatic aberration corrector 300 makes it possible to correct spherical aberration in addition to chromatic aberration.

The third multipole element 310 and fourth multipole element 320 of the chromatic aberration corrector 300 may superimpose magnetic fields of four-fold symmetry instead of electric fields of four-fold symmetry. Also in this case, spherical aberration can be corrected in addition to chromatic aberration.

(3) Third Modification

Figure 13:
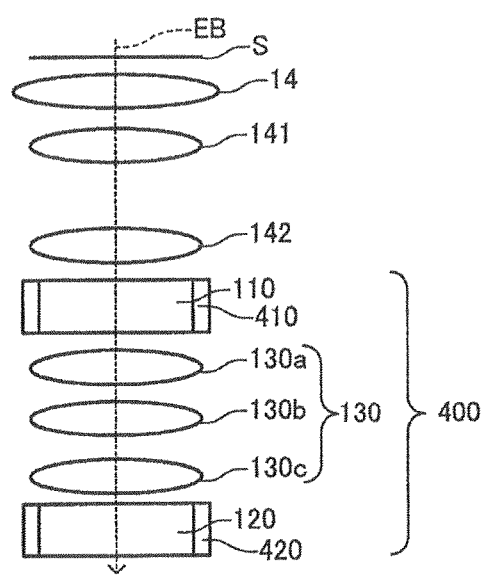
FIG. 13 is a schematic ray diagram illustrating the optical system of a chromatic aberration corrector associated with a third modification of the first embodiment.

A third modification is next described. FIG. 13 shows the optical system of a chromatic aberration corrector, 400, associated with the third modification. Those members of the chromatic aberration corrector 400 which are similar in function with their respective counterparts of the aforementioned chromatic aberration corrector 100 are indicated by the same reference numerals as in the above-cited figures and a detail description thereof is omitted.

The chromatic aberration corrector 400 includes a third multipole element 410 for superimposing an electric field of three-fold symmetry on the first electromagnetic field produced by the first multipole element 110 and a fourth multipole element 420 for superimposing an electric field of three-fold symmetry on the second electromagnetic field produced by the second multipole element 120. Consequently, the chromatic aberration corrector 400 can correct spherical aberration in addition to chromatic aberration.

The third multipole element 410 superimposes the electric field of three-fold symmetry on the quadrupole field of superimposed electric and magnetic fields produced by the first portion 110a or third portion 110c of the first multipole element 110. The fourth multipole element 420 superimposes the electric field of three-fold symmetry on the quadrupole field of superimposed electric and magnetic fields produced by the first portion 120a or third portion 120c of the second multipole element 120. Each of the third multipole element 410 and fourth multipole element 420 is a hexapole element, for example.

Where the electron beam EB is spread in the multipole elements 110 and 120, if a three-fold astigmatism is superimposed, spherical aberration can be corrected. Therefore, the chromatic aberration corrector 400 makes it possible to correct spherical aberration in addition to chromatic aberration.

The third multipole element 410 and fourth multipole element 420 of the chromatic aberration corrector 400 may superimpose magnetic fields of three-fold symmetry instead of electric fields of three-fold symmetry. Also in this case, spherical aberration can be corrected in addition to chromatic aberration.

(4) Fourth Modification

Figure 14:
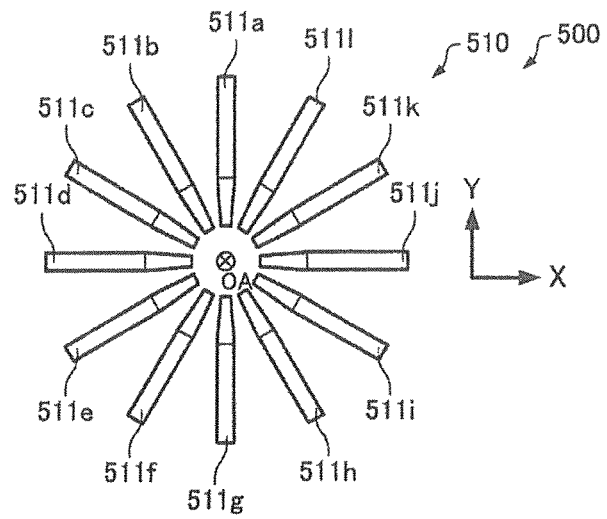
FIG. 14 is a schematic plan view of a first multipole element of a chromatic aberration corrector associated with a fourth modification of the first embodiment.
Figure 15:
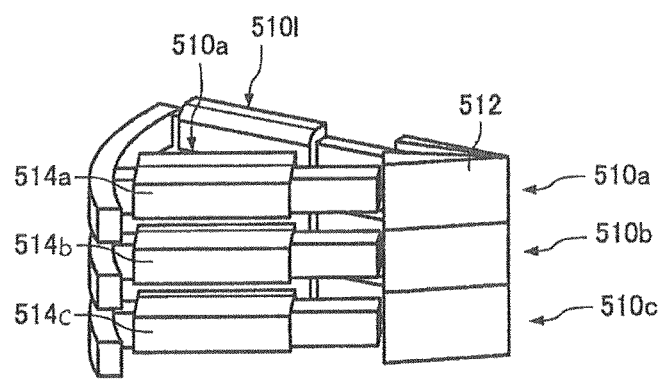
FIG. 15 is a schematic perspective view of the poles of the first multipole element of the chromatic aberration corrector shown in FIG. 14.

A fourth modification is next described. FIG. 14 is a schematic plan view of a first multipole element 510 of a chromatic aberration corrector 500 associated with the fourth modification. FIG. 15 is a schematic perspective view of poles 510a, 510b, and 510c of the first multipole element 510 of the chromatic aberration corrector 500. FIG. 14 is a view of the chromatic aberration corrector 500 taken along the optical axis OA. Those members of the chromatic aberration corrector 500 which are similar in function with their respective counterparts of the aforementioned chromatic aberration corrector 100 are indicated by the same reference numerals as in the above-cited figures and a detail description thereof is omitted.

In the above example of chromatic aberration corrector 100, the various portions 110a, 110b, and 110c of the first multipole element 110 are configured including the quadrupole electrodes 112a-112d and quadrupole magnetic poles 114a-114d as shown in FIG. 4. Furthermore, the various portions 120a, 120b, and 120c of the second multipole element 120 are configured including the quadrupole electrodes 122a-122d and quadrupole magnetic poles 124a-124d as shown in FIG. 8.

In contrast, in the chromatic aberration corrector 500, each of the first portion 510a, second portion 510b, and third portion 510c of the first multipole element 510 is a dodecapole (12-pole) element as shown in FIG. 14. The three portions 510a, 510b, and 510c of the first multipole element 510 produce quadrupole fields of superimposed electric and magnetic fields using dodecapole elements.

The first multipole element 510 is configured including 12 poles 511a-511l which are arranged around the optical axis OA. The pole 511a of the first multipole element 510 has an electrode 512 and three stages of magnetic poles 514a, 514b, and 514c as shown in FIG. 15. Each of the other poles 511b-511l of the first multipole element 510 has the common electrode 512 and three stages of magnetic poles 514a, 514b, and 514c in the same way as the pole 511a.

The electrode 512 extends from the first portion 510a to the third portion 510c of the first multipole element 510. That is, the electrode 512 is shared among the portions 510a, 510b, and 510c.

The magnetic pole 514a constitutes the first portion 510a of the first multipole element 510. The magnetic pole 514a and electrode 512 of the poles 511a-511l produce a quadrupole field of superimposed electric and magnetic fields in the first portion 510a.

The magnetic pole 514b constitutes the second portion 510b of the first multipole element 510. The magnetic pole 514b and electrode 512 of the poles 511a-511l produce a quadrupole field of superimposed electric and magnetic fields in the second portion 510b.

The magnetic pole 514c constitutes the third portion 510c of the first multipole element 510. The magnetic pole 514c and electrode 512 of the poles 511a-511l produce a quadrupole field of superimposed electric and magnetic fields in the third portion 510c.

The second multipole element 520 is similar in configuration with the first multipole element 510 and a description thereof is omitted.

The chromatic aberration corrector 500 can yield the same advantageous effects as the chromatic aberration corrector 100.

2. Second Embodiment

Figure 16:
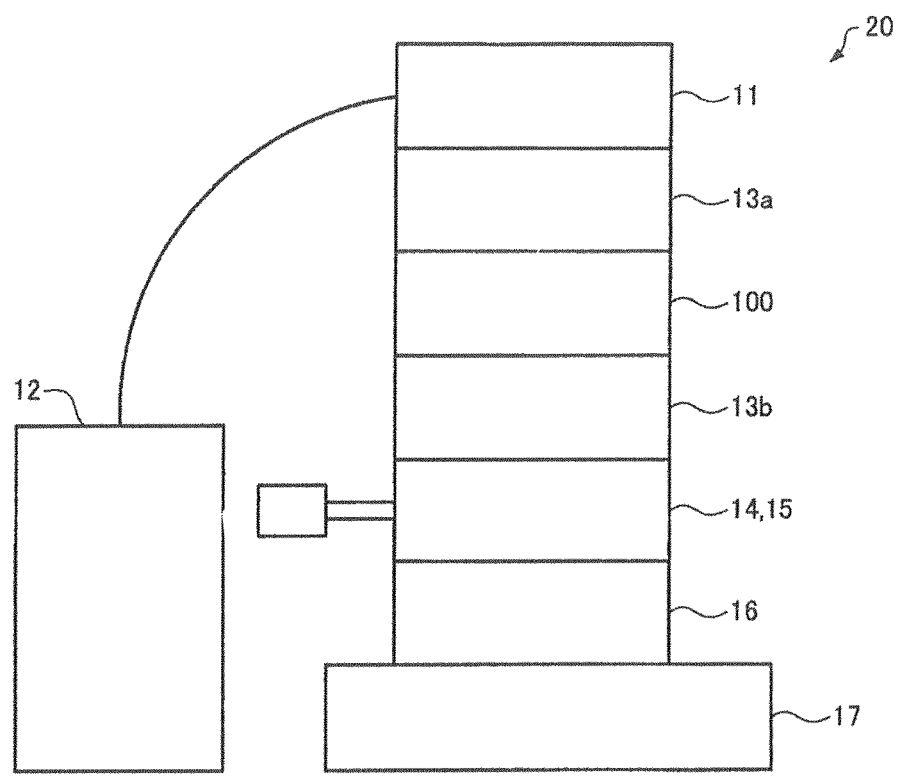
FIG. 16 is a block diagram showing the configuration of an electron microscope associated with a second embodiment of the present invention.

An electron microscope associated with a second embodiment of the present invention is next described by referring to FIG. 16, which shows the configuration of the electron microscope, 20. Those members of the electron microscope 20 which are similar in function with their respective counterparts of the above-described electron microscope 10 are indicated by the same reference numerals as in the above-cited figures and a detail description thereof is omitted.

In the above first embodiment, the chromatic aberration corrector associated with the present invention is used as an aberration corrector for the imaging system.

In contrast, in the electron microscope 20 associated with the second embodiment, the chromatic aberration corrector associated with the present invention is used as an aberration corrector for the illuminating system. A case in which the chromatic aberration corrector 100 is used as a chromatic aberration corrector associated with the present invention is now described.

The electron microscope 20 is configured including an electron gun 11, a high-voltage control portion 12, a first condenser lens 13a, the chromatic aberration corrector 100, a second condenser lens 13b, an objective lens 14, a specimen stage 15, an intermediate projector lens 16, and an observation chamber 17.

The electron gun 11 has a high-voltage power supply under control of the high-voltage control portion 12 and produces an electron beam.

The first condenser lens 13a focuses the electron beam produced by the electron gun 11. The focused beam enters the chromatic aberration corrector 100.

The chromatic aberration corrector 100 corrects aberrations in the first condenser lens 13a. The electron beam whose chromatic aberration has been corrected by the chromatic aberration corrector 100 is focused by the second condenser lens 13b. The focused beam then passes through the objective lens 14 and specimen stage 15.

The intermediate projector lens 16 cooperates with the objective lens 14 to constitute an imaging system. The intermediate projector lens 16 focuses the beam onto a camera (not shown) within the observation chamber 17.

Since the electron microscope 20 contains the chromatic aberration corrector 100, chromatic aberration in the illuminating system (i.e., the first condenser lens 13a) can be corrected. Accordingly, the electron microscope 20 can have high resolution. Furthermore, in the electron microscope 20, the chromatic aberration corrector 100 can correct aberrations by efficiently producing negative chromatic aberrations. Accordingly, with the electron microscope 20, the length or thickness of the first multipole element 110 can be reduced and the resolution can be improved. In addition, the electron microscope 20 is equipped with the chromatic aberration corrector 100 and so alignments can be made easily.

The above-described embodiments and modifications are merely exemplary and the present invention is not restricted to them. For example, the embodiments and modifications may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described our invention with the detail and particularity required by the Patent Laws, what is desired protected by Letters Patent is set forth in the following claims.

The invention claimed is:

1. A chromatic aberration corrector for use with an electron microscope, said chromatic aberration corrector comprising:
   a first multipole element for producing a first electromagnetic field; and
   a second multipole element for producing a second electromagnetic field,
   wherein said first multipole element has a first portion, a second portion, and a third portion arranged along an optical axis;
   wherein each of the first portion, second portion, and third portion has a thickness in the direction of travel of an electron beam and produces a quadrupole field in which an electric quadrupole field and a magnetic quadrupole field are superimposed;
   wherein in said first portion, the electric quadrupole field is set stronger than the magnetic quadrupole field;
   wherein in said second portion, the magnetic quadrupole field is set stronger than the electric quadrupole field;
   wherein in said third portion, the electric quadrupole field is set stronger than the magnetic quadrupole field;
   wherein said second portion produces a two-fold astigmatism component that is opposite in sign to two-fold astigmatism components produced by the first and third portions; and
   wherein said second electromagnetic field is angularly shifted by 90 degrees about the optical axis with respect to said first electromagnetic field.

2. The chromatic aberration corrector as set forth in claim 1, wherein the electric quadrupole field component of said first electromagnetic field is constant along said optical axis.

3. The chromatic aberration corrector as set forth in claim 1, wherein said first multipole element has plural electrodes extending from said first portion to said third portion, and wherein said electrodes produce uniform electric quadrupole fields in all of the first portion, the second portion, and third portion.

4. The chromatic aberration corrector as set forth in claim 1, further comprising a transfer lens disposed between said first multipole element and said second multipole element.

5. The chromatic aberration corrector as set forth in claim 1, further comprising: a third multipole element for superimposing an electric or magnetic field of four-fold symmetry on said first electromagnetic field; and a fourth multipole element for superimposing an electric or magnetic field of four-fold symmetry on said second electromagnetic field.

6. The chromatic aberration corrector as set forth in claim 1, further comprising: a third multipole element for superimposing an electric or magnetic field of three-fold symmetry on said first electromagnetic field; and a fourth multipole element for superimposing an electric or magnetic field of three-fold symmetry on said second electromagnetic field.

7. The chromatic aberration corrector as set forth in claim 1, wherein said first portion and said third portion have concave lens action, and wherein said second portion has convex lens action.

8. An electron microscope including a chromatic aberration corrector as set forth in any one of claims 1 to 7.

* * * * *